United States Patent [19]

Inoue et al.

[11] Patent Number: 5,175,746
[45] Date of Patent: Dec. 29, 1992

[54] RECEIVING APPARATUS AND TRANSMITTING-RECEIVING APPARATUS

[75] Inventors: Yutaka Inoue, Tokyo; Tatsuya Yaguchi, Yokohama; Yuko Ichikawa, Tokyo, all of Japan

[73] Assignee: Canon Kabushiki Kaisha, Tokyo, Japan

[21] Appl. No.: 258,163

[22] Filed: Oct. 14, 1988

[30] Foreign Application Priority Data

| Oct. 14, 1987 [JP] | Japan | 62-258805 |
| Oct. 19, 1987 [JP] | Japan | 62-264636 |
| Jan. 29, 1988 [JP] | Japan | 63-017408 |

[51] Int. Cl.⁵ .................................................. H03H 7/30
[52] U.S. Cl. .......................................... 375/13; 375/118
[58] Field of Search .................. 375/14, 118, 13, 12, 375/11; 364/724.2, 724.16; 333/18

[56] References Cited

U.S. PATENT DOCUMENTS

| 3,566,271 | 2/1971 | Whang et al. | 375/12 |
| 3,715,691 | 2/1973 | Kurth | 375/14 X |
| 4,285,061 | 8/1981 | Ho | 375/15 |
| 4,489,416 | 12/1984 | Stuart | 375/13 |
| 4,674,103 | 6/1987 | Chevillat et al. | 375/13 |
| 4,701,936 | 10/1987 | Clark et al. | 375/13 |
| 4,792,964 | 12/1988 | Yoshida | 375/118 |
| 4,817,114 | 3/1989 | Boer et al. | 375/14 X |
| 4,849,989 | 7/1989 | Kamerman | 375/13 |

Primary Examiner—Curtis Kuntz
Assistant Examiner—Tesfaldet Bocure
Attorney, Agent, or Firm—Fitzpatrick, Cella, Harper & Scinto

[57] ABSTRACT

This invention relates to a model apparatus equipped with an equalizer having a transversal filter and adapted so that equalizing characteristics can be set automatically at the time of data communication. A predetermined amount of received training data is stored in memory, the training data stored in intervals between receipt of the training data is read out of the memory, and tap gains of the transversal filter are computed and set in dependence upon the read data, thereby controlling the equalizing characteristics of the equalizer. A mirror image of a past jitter component from the equalizer output obtained before the present point in time is formed by folding over the jitter component at the present point in time. By using the mirror image as a prediction portion, an approaching jitter component is predicted and the equalizing characteristics of the equalizer are controlled so as to cancel out the predicted jitter component. Jitter component removal processing is started by such control. Further inverse characteristics of transmission line transmission characteristics for every communicating party on a connecting communication line are stored in memory upon correlating the inverse characteristics with the communicating parties. At communication with one of the parties, the inverse characteristics stored in correlation with this party are read out and the equalizing characteristics are controlled accordingly.

46 Claims, 13 Drawing Sheets (PRIOR ART)        (PRIOR ART)

RECEIVING APPARATUS AND TRANSMITTING-RECEIVING APPARATUS

BACKGROUND OF THE INVENTION

Field of the Invention

This invention relates to a receiving apparatus for automatically setting reception characteristics in data communication to absorb the effects of, e.g., line jitter. The invention also relates to a transmitting-receiving apparatus for use in data communication.

When digital signal data is transmitted via an ordinary pay station line, which is an analog line, it is required that the digital data be modulated and converted into the desired analog signal before being sent, and it is required that the modulated signal be demodulated on the receiving side. Modems for this purpose are essential in both the transmitting apparatus and receiving apparatus.

In presently existing GIII-type Facsimile machines in which the data transmission rate has been raised, data can be transmitted at a high speed, namely at an information transmission speed of 9600 bps (bits/sec). The signal modulated by the modem on the transmitting side and then transmitted over a line is received by the receiving apparatus but on the way is distorted due to line distortion, jitter, transmitting-receiving timing error, carrier error and the like. This signal is received by the modem on the receiving side. Such modem incorporates an equalizer which corrects for this distortion. As a result, the corrected signal outputted from the modem on the receiving side is the original transmitted signal.

The operation of this equalizer will now be described with reference to FIG. 12 and FIGS. 13(a) through (c).

In FIG. 12, numeral 10 denotes the modem on the transmitting side, 20 the modem on the receiving side, 21 the equalizer, which is incorporated in the receiving-side modem 20, and 30 a line connected the two modems.

The line 30 has a frequency characteristic, and the transmission characteristic thereof is as shown in FIG. 13(b), by way of example. Even if a signal aK having the frequency characteristic shown in FIG. 13(a) is transmitted by the modem 10 on the transmitting side, a signal Rk received by the receiving-side modem 20 is influenced by the transmission characteristic and takes on, for example, the form shown in FIG. 13(b). When the receiving-side modem 20 is provided with the equalizer 21 having a frequency characteristic (FIG. 13c) which is the inverse of the frequency characteristic of line 30, the composite characteristic of the line and equalizer [a characteristic obtained by superimposing these two characteristics (simple multiplication in the frequency domain)] becomes the flat characteristic shown in FIG. 13(a). As a result, distortion-free signal transmission becomes possible.

Thus, the function of the equalizer 21 is to produce a characteristic which is the inverse of the line characteristic.

Ordinarily, in order to produce the equalizing characteristic of the equalizer, normalized data referred to as training data is transmitted in advance of data transmission, and the equalizing characteristic is set automatically while the training data is being accepted.

However, in the prior art described above, the automatic setting is performed by computing the equalizing characteristic each time one bit of the training data is received, by way of example. Consequently, a comparatively long training time is required to complete the automatic setting.

The length of the training time is not a particular problem when data is transmitted to only one location. However, in a case where the same data is sent simultaneously, to a plurality of locations, e.g., to 20 or 30 locations, the length of training time has a major influence upon overall transmission time and tends to impede rapid transmission.

A polling system illustrated in FIG. 14 may be considered as one example of a signal transmission application which uses transceivers (modems) connected to a line having different transmission frequency characteristics.

This system, which may be thought of as an on-line service system such as a cash dispenser at a bank or the like, includes a master station A and a plurality of slave stations B, C, D, E . . . interconnected by a transmission line 120. The master station A is incapable of simultaneously receiving signals from the plurality of slave stations B through E. The transmission line 120 is used on a time-shared basis so that a signal can be received from one of the slave stations in response to a request from this slave station. A modem is disposed at the transmission line terminal of each station.

Since the slave stations are located at different distances from the master station A, the transmission frequency characteristics between the master station and each slave station differ. However, it is required that a request from each slave station be responded to quickly.

In a case where an extended period of time is needed to respond to a request from a slave station, a request from another slave station cannot be accepted, request waiting time increases and efficiency declines. Moreover, line utilization time increases and, as a result, so does the number of lines used.

In particular, since the master station A in the conventional system can only perform a fixed equalizing operation regardless of which slave station issues a signal, as mentioned above, equalizing speed is required and efficiency suffers.

Furthermore, phase jitter generated in the transmission line is a component that cannot be removed by the equalizer itself. Phase jitter is a phenomenon in which the phase of the transmitted data revolves (i.e., is phase modulated) on the line due to a commercial frequency (50 Hz, 60 Hz) component. As far as the equalizer is concerned, this is a very rapid fluctuating component which cannot be absorbed by the conventional equalizer. That is, since the equalizer outputs the results of computations using data in a certain range in terms of time, the output itself contains all of the jitter component in the same range of time.

In order to remove such a fluctuating component, the prior art adopts a jitter suppression method based on the arrangement shown in FIG. 15. This conventional jitter suppression method will now be described with reference to FIG. 15 showing the equalizing section of the prior art.

As shown in FIG. 15, the conventional equalizing section includes an equalizer 114 for eliminating received data distortion, a decision unit 115 for judging data transmitted from the output of the equalizer 114, a phase detector 150 for extracting a jitter component from the equalized output signal, and a phase controller 151. This arrangement corrects for jitter by means of feedback control. The reason for correcting jitter at this position is that the jitter component can be easily detected since line distortion is equalized by the equalizer 114.

Since the influence of jitter appears as a revolving component of the data, rotation in the direction opposite that of the jitter phase detected by the phase detector 150 is applied by a phase rotating unit 152, whereby the jitter component is eliminated. This phase rotation is carried out by multiplying the output of the equalizer 114 by a wave having a predetermined phase.

Accordingly, with the example of conventional control shown in FIG. 15, phase control is applied in dependence upon the amount of jitter detected from the equalized output. As a consequence, the amount of phase controlled is merely an average value seen in the time span of the equalizer. This means that the jitter component cannot be completely removed. As a result, an error component cannot be made smaller than a certain value, thereby bringing about a deterioration in transmission quality.

SUMMARY OF THE INVENTION

The foregoing problems are not limited to the automatic setting of an equalizer but also arise in the automatic setting of other reception characteristics of a receiving apparatus.

Accordingly, an object of the present invention is to provide a communications apparatus in which reception characteristics can be automatically set in a short period of time.

According to the present invention, the foregoing object is attained by providing a receiving apparatus having means for storing input data over a plurality of cycles, and means for setting reception characteristics upon reading out the stored input data a plurality of times whenever the input data is stored in the storing means.

In the above arrangement, the reception characteristics are set automatically upon reading out the stored input data whenever the data is stored in the storing means.

Another object of the invention is to provide a receiving apparatus exhibiting high jitter suppression, namely excellent transmission quality.

According to the present invention, the foregoing object is attained by providing a receiving apparatus having means for detecting jitter in transmitted data outputted through an equalizer, and means for controlling the equalizing characteristics of the equalizer in dependence upon the jitter detected by the detecting means.

In the above arrangement, the equalizing characteristics of the equalizer are controlled in dependence upon the jitter detected by the detecting means.

Furthermore, the invention provides a transmitting-receiving apparatus comprising storing means for storing inverse characteristics which are the inverse of a plurality of transmission line transmission characteristics, selecting means for selecting one of the inverse characteristics stored in the storing means, and equalizing means for executing received data equalizing processing in accordance with the characteristics selected by the selecting means.

In the above arrangement, a plurality of predicted line inverse characteristics corresponding to connected lines are preserved in memory, and equalizing processing is executed upon presetting the same inverse characteristics corresponding to each connected line before equalization is started, whereby equalizing processing is executed quickly and reliably even with regard to a line having a plurality of transmission frequency characteristics.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Embodiments of the present invention will now be described in detail with reference to the drawings.

First Embodiment

In the embodiment described hereinbelow, there is disclosed an equalizer which realizes fast training by utilizing old received data (training data) and re-performing equalization setting a plurality of times within a single conventional equalization time period. However, the present invention is not limited to this equalizer.

A digital signal processor (hereinafter referred to as a "DSP") often finds use in digital signal processing of the kind described above and is a programmable integrated circuit incorporating a high-speed accumulator. In recent years, DSP processing speed has been improved and multiplication and addition processing can now be performed in 150 nsec.

The apparatus illustrated in this embodiment makes possible simple and high-speed equalization processing and can be realized in a simple manner by utilizing the abovementioned high-speed DSP processing without performing complicated processing such as multiplexing processing.

A first embodiment of the invention will be described with reference to the drawings. The description will rendered on the premise that a DSP is used. However, the invention is not limited to arrangements using a DSP. The algorithm will be the same and there will be no difference in effects even if the invention is realized by means of a hardware arrangement.

Figure 1:
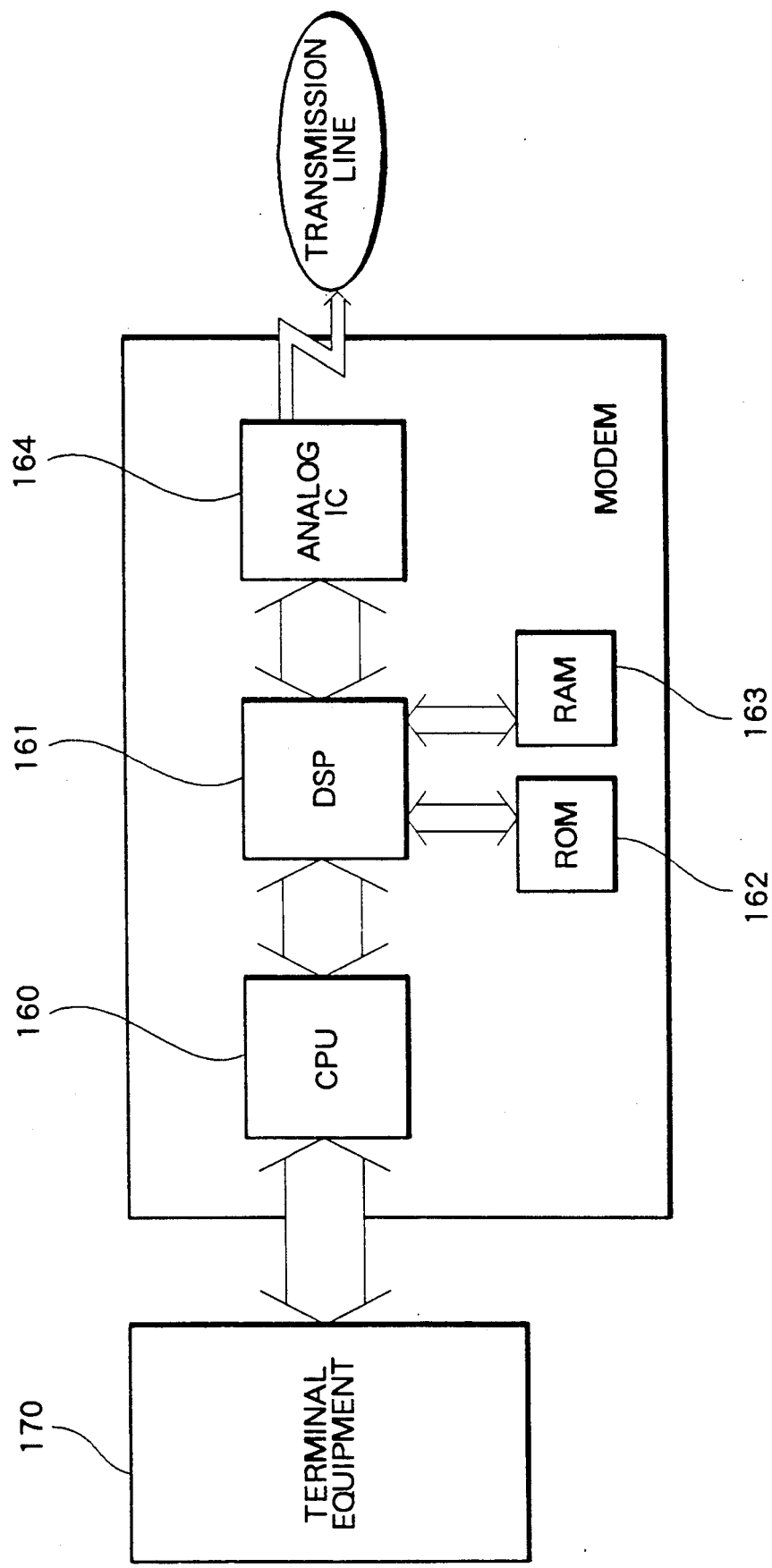
FIG. 1 is a view showing the general construction of a modem using a DSP embodying the present invention.

FIG. 1 is a view showing the general construction of a modem using a DSP according to the present embodiment of the invention. The modem includes a CPU 160 for sequential control of the system and for interfacing terminal equipment 170, and a DSP 161 for executing digital signal processing such as equalizing processing in response to a command from the terminal equipment 170 and CPU 160. The DSP 161 has internal or external memories (here, a ROM 162 and a RAM 163, which are illustrated as being external memories) for storing instructions and data. The modem further includes an analog IC 164 in which an A/D converter, D/A converter, analog filter and the like are integrated for processing other than digital processing. The analog IC 164 is directly connected to a transmission line 120 (FIG. 2).

In actuality, the equalizer and the like are formed by microcodes in the internal memory of the DSP.

Figure 2:
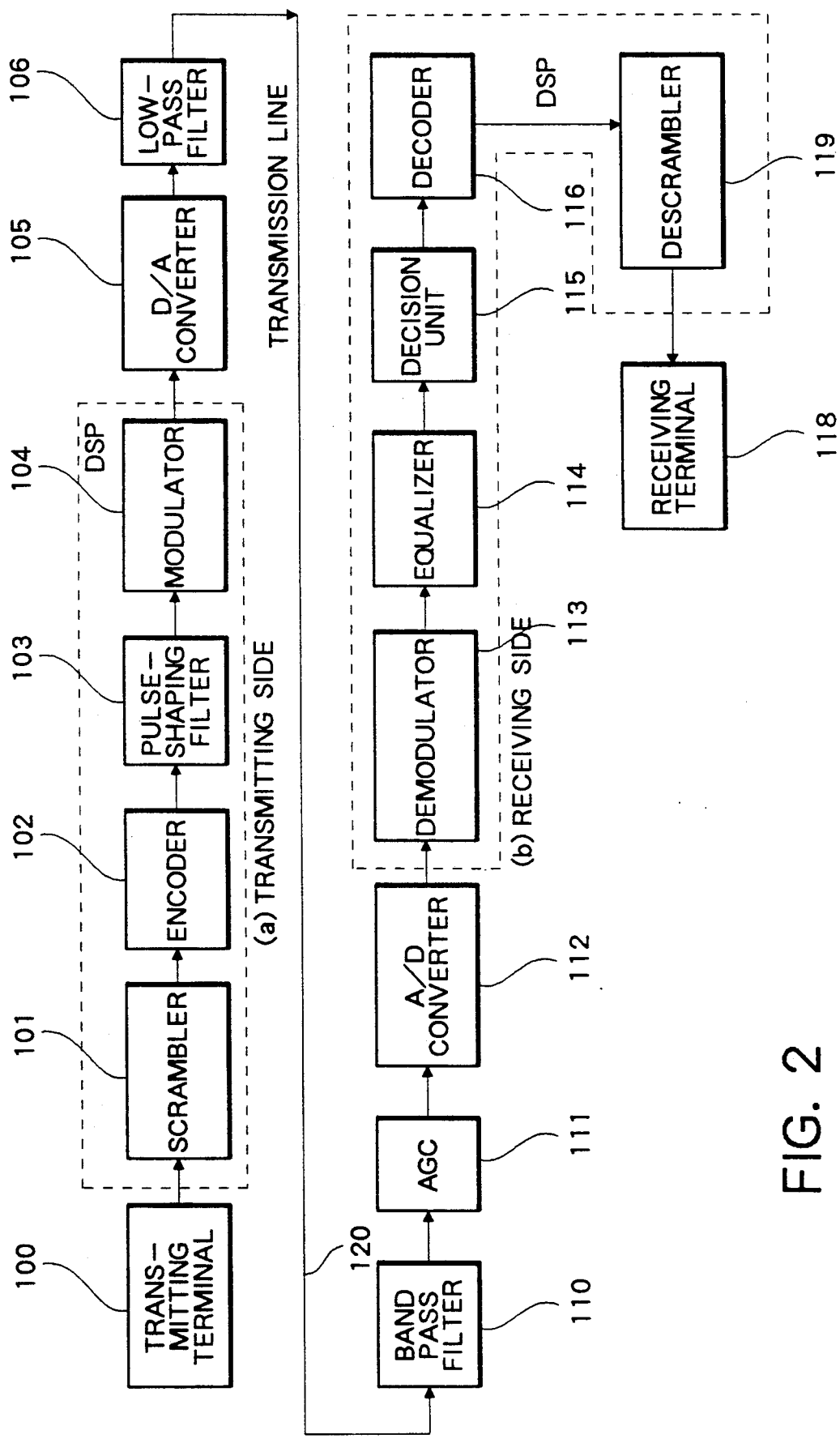
FIG. 2 is a view showing the detailed construction of a modem according to the present embodiment.

FIG. 2 is a block diagram showing the details of the modem of FIG. 1.

In FIG. 2, the portions enclosed by the dashed lines are constituted by DSP's (digital signal processors). Numerals 100 denotes a transmitting terminal for generating a digital signal to be transmitted, and 118 a receiving terminal The terminals 100, 118 are connected to the modem of this embodiment. The DSP on the transmitting side includes a scrambler 101 for clarifying the partitions in the signal on the receiving side, randomizing the transmitted data and preventing a continuous-output of the same data, an encoder 102 for assigning a code to the signal from the scrambler 101 every tri-bit or di-bit, etc., a wave-shaping filter (roll-off filter) 103 which prevents interference between codes of the signal, and a modulator 104 for subjecting the signal from the wave-shaping filter 103 to predetermined modulation processing to place the signal on a carrier wave. Various modulating methods which depend upon data transfer speed and the like can be employed by the modulator 104. Typical examples are phase modulation (PSK) for varying the phase of the carrier wave, frequency modulation (FSK) for varying the frequency of the carrier wave, amplitude modulation (AM) for varying the amplitude of the carrier wave, and orthogonal amplitude modulation (QAM) for varying the amplitude and phase of the carrier wave. In this embodiment, orthogonal amplitude modulation (QAM) is adopted.

The signal modulated by the modulator 104 is converted into an analog signal, which is to be sent to an analog pay line, by a D/A converter 105. The resulting analog signal is applied to a low-pass filter 106, which removes excess high-frequency components to bring the signal into conformance with the transmission band of the transmission line. The output of the low-pass filter is delivered to the transmission line.

The transmitted signal is delivered from the transmission line to the band pass filter 110, which removes components other than those of the transmission band. The resulting signal is then applied to an AGC 111, where the signal is controlled to have a signal level that can be handled on the receiving side. The output of the AGC 111 is converted into a digital signal by an A/D converter 112. This digital signal is applied to the DSP on the receiving side. This DSP includes a demodulator 113, where the demodulated signal is demodulated into the original signal that existed before modulation, an equalizer 114 for removing distortion components, which are picked up during transmission, from the received signal, thereby extracting the original transmitted signal, a decision unit 115, which discriminates the output of the equalizer 114 in terms of code points, a decoder 116 for decoding the output of the decision unit 115, and a descrambler 119 to which the decoded signal is sent. The signal randomized by the scrambler 101 on the transmitting side is thus restored to its original form. In this way the signal is restored to a signal the same as the signal transmitted from the transmitting terminal 100, and this restored signal is outputted to the receiving terminal 118.

Thus, by using modems, it is possible to transmit a digital signal via a pay line, which is an analog circuit.

Figure 3:
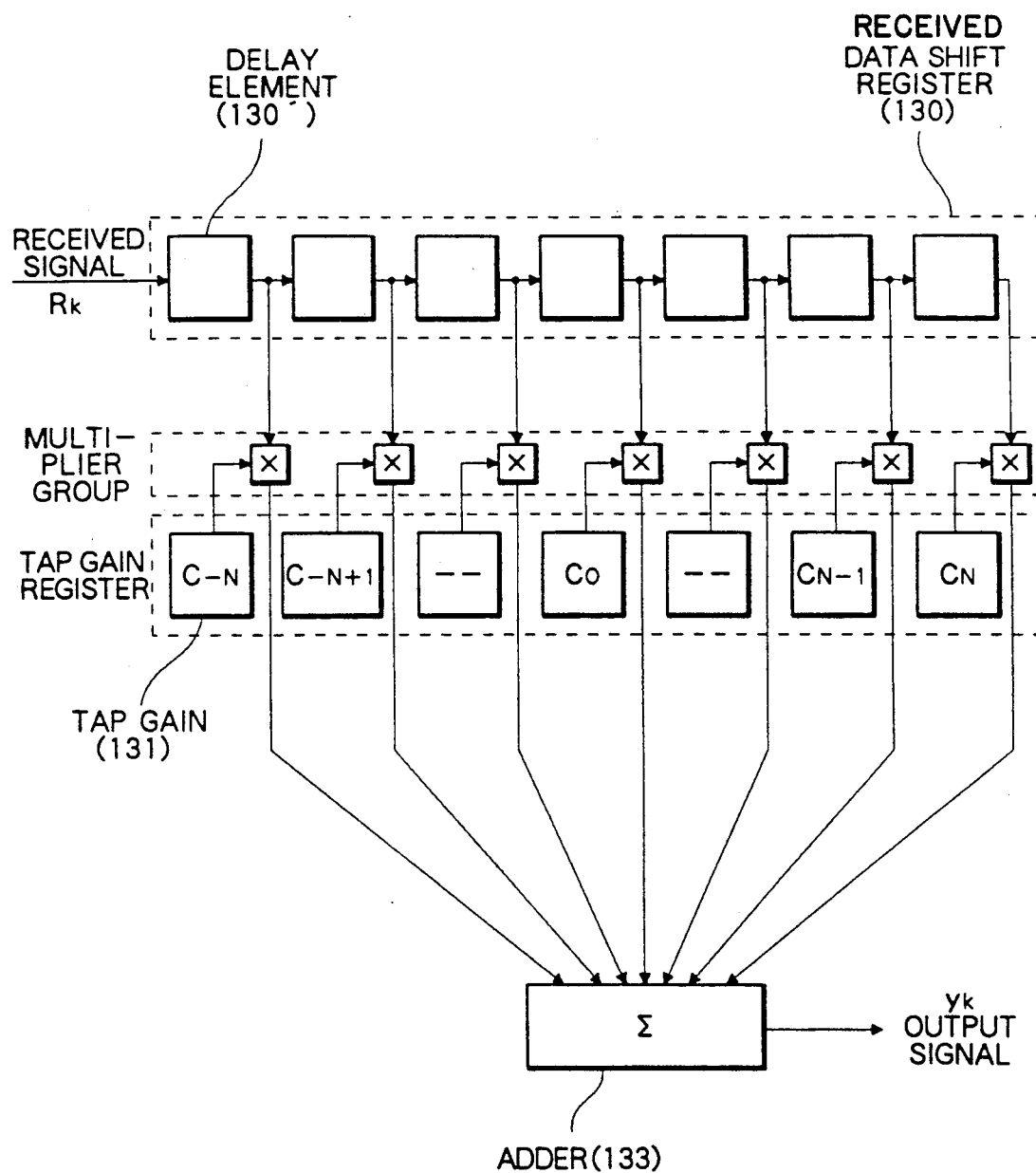
FIG. 3 is a view showing the internal construction of an equalizer illustrated in FIG. 2.

The construction of the equalizer 114 in FIG. 2 is shown in FIG. 3.

The equalizer 114 includes a received-data shift register 130 for transmitting the received data one bit at a time, a tap gain register 131 for generating tap gains by which the outputs of the respective stages of the register 130 are to be multiplied, multipliers 132 for multiplying the tap gains by the outputs of the respective stages of the shift register 130, and an adder 133 for computing the sum of the outputs of the multipliers 132.

Figure 9:
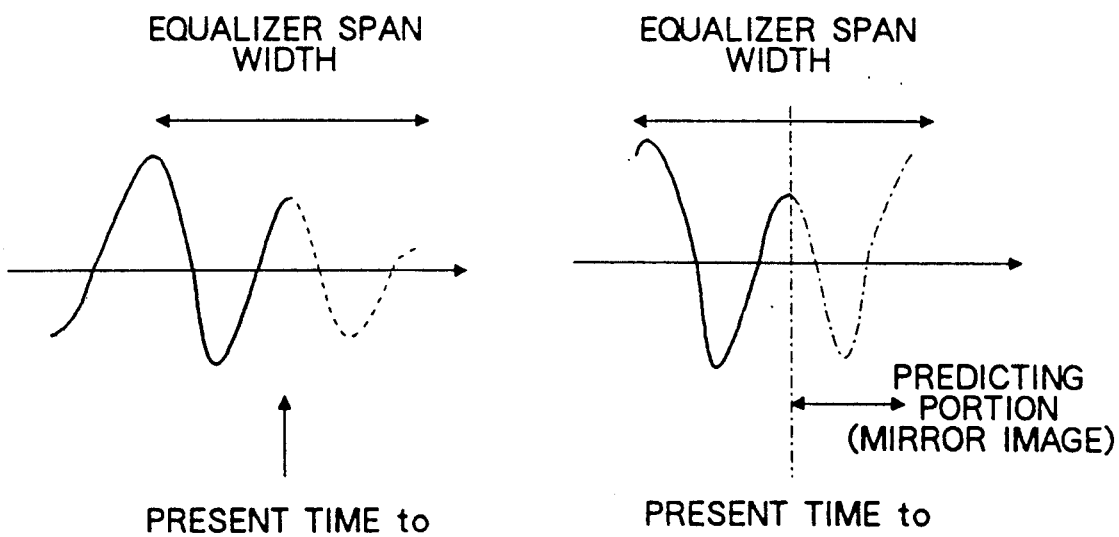
FIGS. 9(a) and 9b) are graphs for describing the operation of a jitter predicting unit in the second embodiment.

The tap gains stored in the tap gain register 131 in the equalizer 114 of the present embodiment are set for signals of a duration corresponding to one span width of the equalizer illustrated in FIG. 9(a). Generally, when tap gains ($C_{-N}$ through $C_N$) stored in the tap gain register 131 are plotted along the time axis, the result is referred to as the unit impulse response of the equalizer. If this is made equal to the frequency characteristic of the transmission line after this characteristic has been subjected to a reverse Fourier transformation, transmission line distortion can be eliminated. More specifically, the output signal Yk of the equalizer will be as indicated by the following equation:

$$Yk = \sum_{i=N}^{N} C_i Rk - 1 \qquad (1)$$

As for the setting of tap gain, training for transmitting predetermined data during transmission and reception is carried out before data communication.

In general, the tap gains ($C_{-N} \sim C_N$) are computed successively in accordance with the following equation using the mean square error method (MSE):

$$Ce^{\gamma-1} = Ce^\gamma - a\frac{e(y_k - a_k)^2}{eCe} \quad (2)$$

where $Ce\gamma$ is the e-th tap gain value calculated the $\gamma$-th time; $(\hat{a})_k$ is the presumed value of the received data $a_k$, in which $\hat{a}_k = a_k$ holds during training; $\alpha$ represents a convergence coefficient (in general, $\alpha << 1$); and $Y_k - (\hat{a})_k$ represents an error signal (ek).

It should be noted that the MSE method described above is an algorithm which minimizes the square of the error signal, i.e., $ek^2$.

The foregoing computation is performed also at the time of data transmission after training to follow up variations in the smooth line characteristics.

The equalizing operation of this embodiment using the equalizer 114 will now be described.

Figure 4:
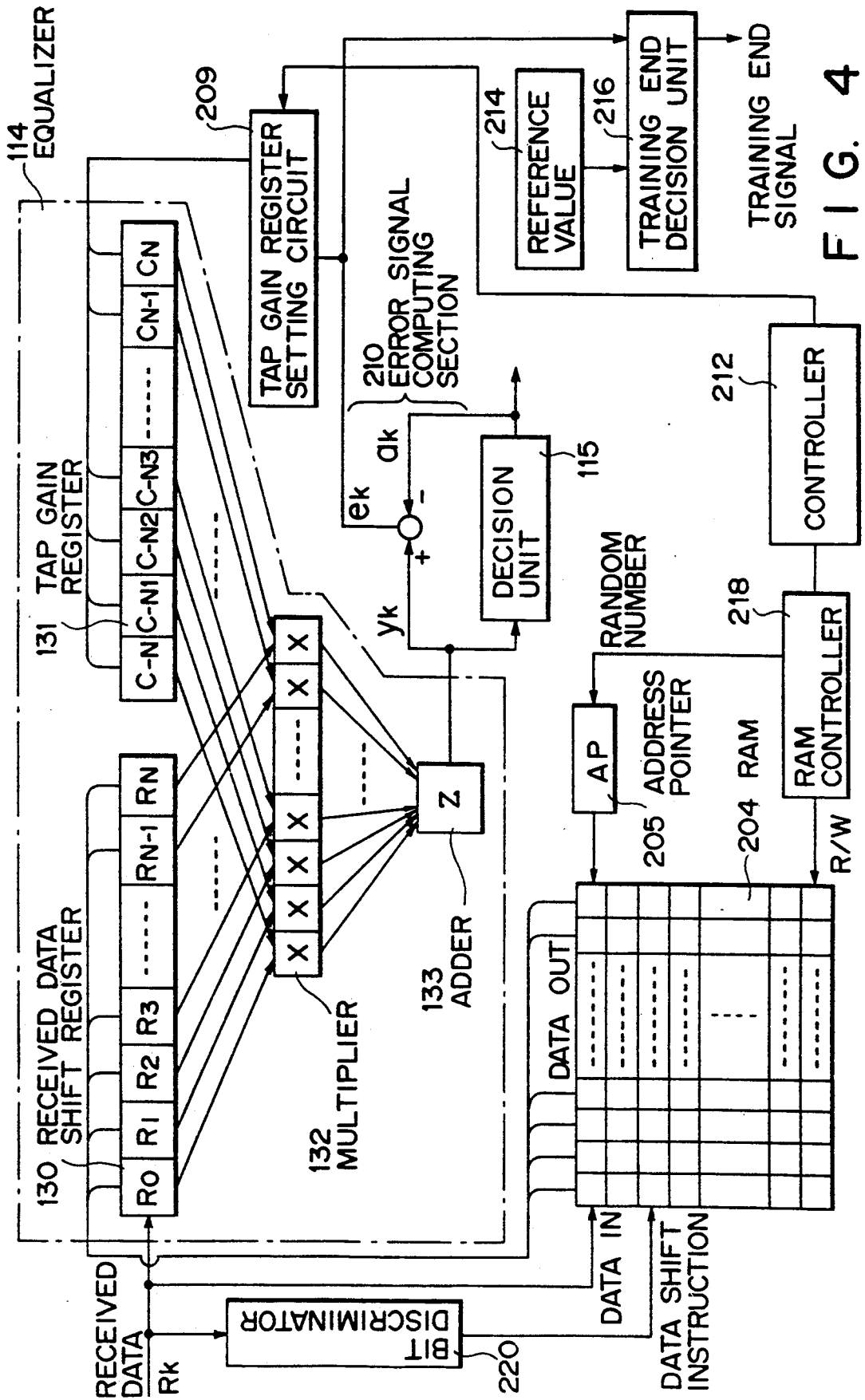
FIG. 4 is an overall block diagram of an equalizing processor according to the present embodiment.

The equalizer of this embodiment is arranged to operate as an automatic equalizer. This is achieved by adding an automatic equalizing controller to the above-described equalizer 114. FIG. 4 is a block diagram showing the overall equalizing section inclusive of the automatic equalizing controller of this embodiment.

In FIG. 4, the equalizer 114 is enclosed by the broken line and is constructed as a transversal filter. The equalizer 114 comprises the received data shift register 130, which is a received data delay element, the tap gain register 131, the multipliers 132 for multiplying the values from register 130 and the respective values from register 131, and the adder 133 for adding the results of the multiplication operation. The decision unit 115 judges, by estimation, to which item of data the signal equalized by the equalizer 114 corresponds. An error signal computing unit 210 obtains the error signal ek from the decision unit output (the estimated value of the transmitted signal) and the output yk of the equalizer. Tap gain is computed based on this value by a tape gain register setting circuit 209 using the MSE method.

In this embodiment, there is provided a read/write memory (RAM) 204 for storing received data Rk inputted to the equalizer 114. The arrangement is such that received data going back several cycles is stored in the RAM 204. This embodiment is further characterized by data the RAM 204 being transferred to the received data shift register 130 of the equalizer 114.

Figure 5A:
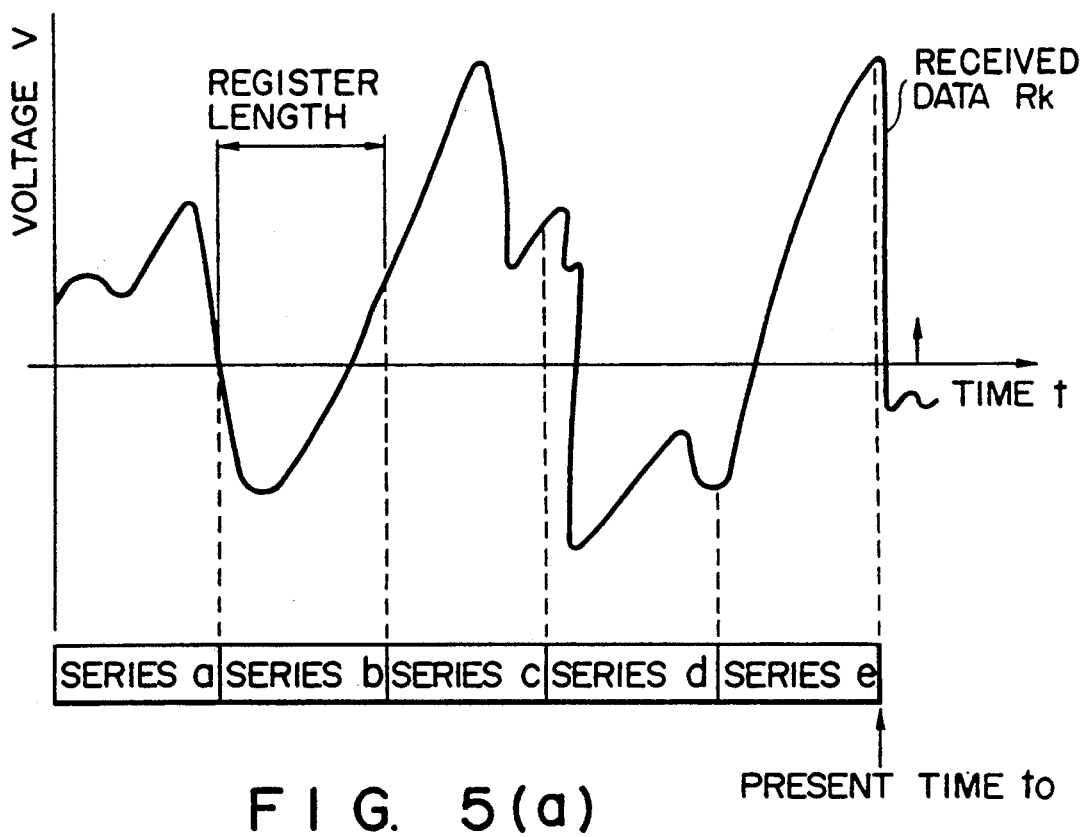
FIGS. 5(a) and (b) are views for describing data stored in a memory in accordance with the present embodiment.
Figure 5B:
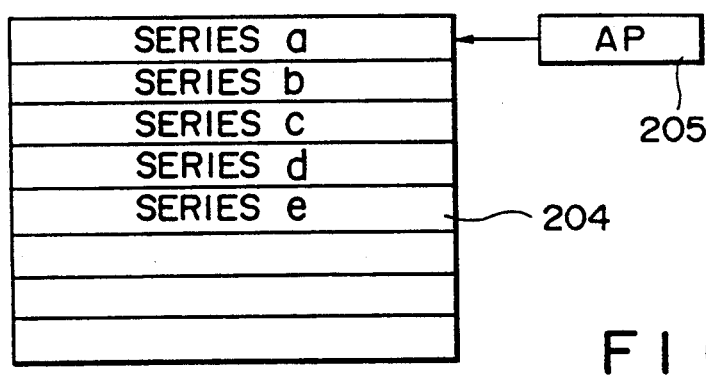
FIG. 5(c) is a timing chart illustrating the timing of received data and the timing at which data is read out of a RAM in accordance with the present embodiment.

The received data Rk stored in the RAM 204 is partitioned into series at the lengths of the registers of the received data shift register 130, as shown in FIG. 5, and the received data is stored in the RAM 204 as shown in FIG. 5(b).

The tap gain register setting circuit 209 executes a computation, described below, in accordance with the error signal outputted by the computing unit 210, thereby setting each item of data in the tap gain register 131. Numeral 212 denotes a controller which causes the tap gain register setting circuit 209 to perform computations and to output data to the register 201. Numeral 214 denotes a reference value generating circuit for generating a reference signal to be compared with the error signal ek obtained by the error signal computing unit 210. Numeral 216 denotes a training end discriminating circuit for comparing the reference signal and the error signal ek and generating a training end signal when the error signal ek becomes smaller than the reference signal. Numeral 218 denotes a RAM controller for controlling the write and read states of the RAM 204 in dependence upon the operating state of the controller 212. Numeral 220 denotes a bit discriminating circuit for discriminating bit-by-bit partitions of the received data.

Figure 6:
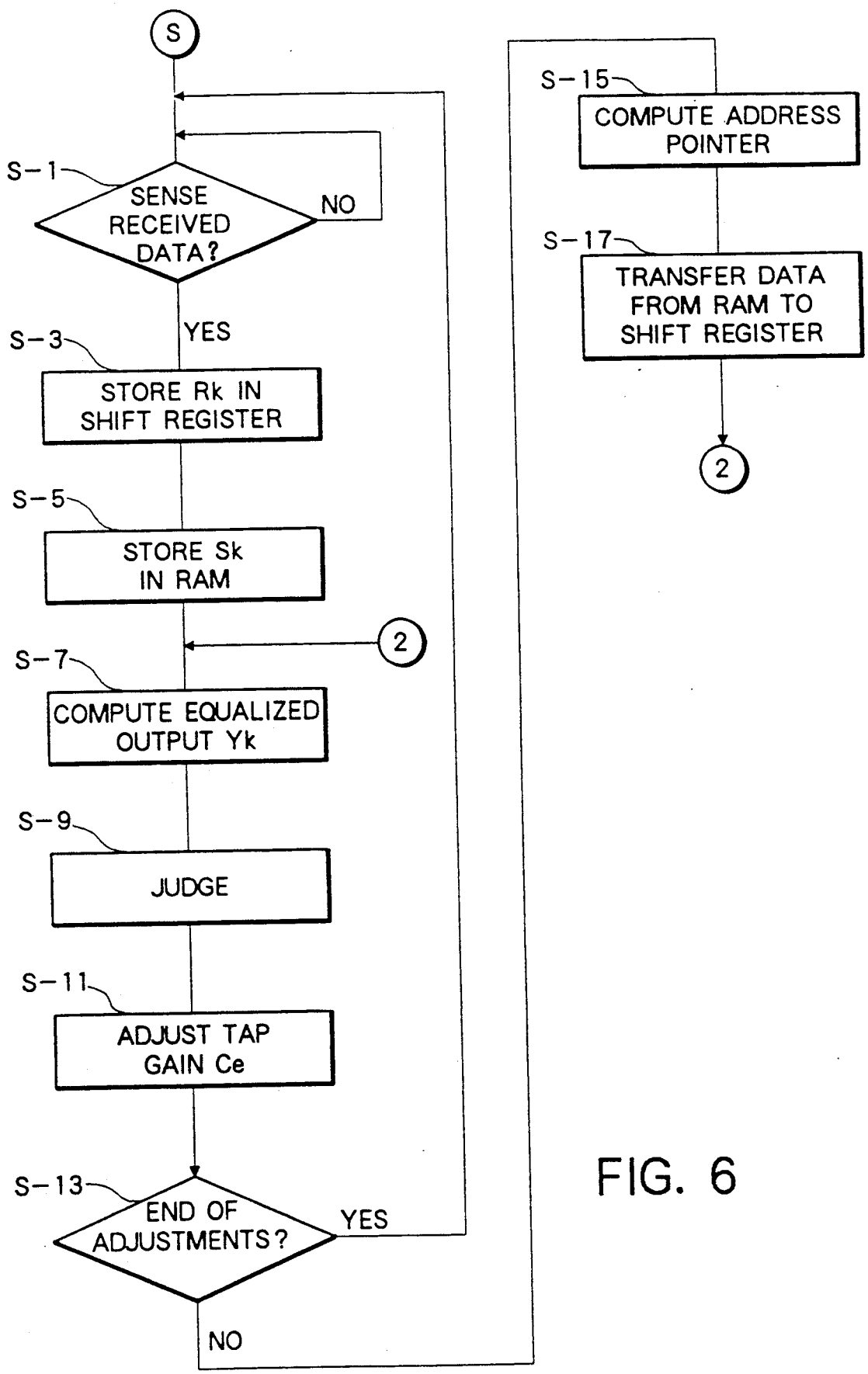
FIG. 6 is a flowchart showing the equalizing operation of the equalizer of the present embodiment.

The equalizing operation of this embodiment constructed as set forth above will now be described with reference to the flowchart of FIG. 6.

A step S-1 is a monitoring step for sensing input of one item of received data Rk. When the receiving data Rk is sensed, the program proceeds to a step S-3, at which Rk is inputted to the received data shift register 130. Rk is also inputted to the RAM 204 at a step S-5. The input address of the RAM 204 is set in advance by an address pointer (AP) 205 generated by the RAM controller 218.

Figure 5C:
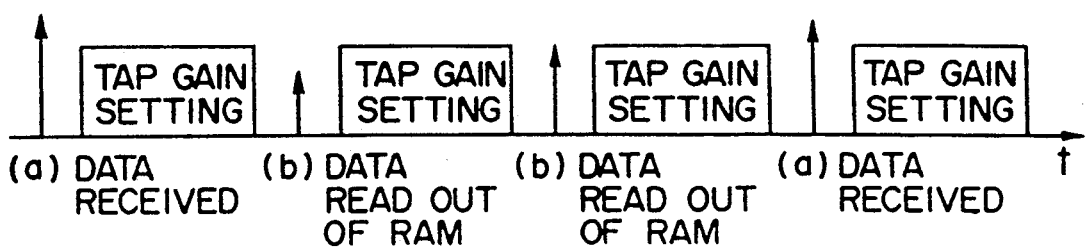

Next, at steps S-7 through S-13, the controller 212 repeatedly executes, an adjusted number of times, the operation of the equalizer, namely computation of the output Yk, the discrimination of this output and the adjustment of the tap gain Ce [by the MSE method of Equation (2)]. In accordance with the prior-art method, the input of the next item of received data Rk is awaited at this point in time. In accordance with the present embodiment of the invention, the abovementioned computation is performed at ultra-high speed by the DSP, so that there is idle time which lasts until the next item of data Rk+1 is received. By utilizing this idle time, the RAM controller 218 is operated at subsequent steps S-15, S-17 to read out the previous data, which has been stored in the RAM 204, as by generating address pointer values in random-number fashion, thereby transferring the data to the received data register 130. Equalization is carried out by setting tap gain again, using this data. In this re-equalization, the number of times the operation is performed is decided in accordance with the idle time, which is dependent upon the DSP processing speed, and a state awaiting input of the received data $R_k$ is established when the operation has been performed the number of times decided. FIG. 5(c) is a timing chart showing the timing of data reception (a) and RAM readout (b). In the example shown in FIG. 5(c), data is read out of the RAM 204 twice, and tap gain is set, after the received data is accepted.

The received data used at the time of the equalizing operation based on the readout of data from the RAM 204 can be decided by being set to any value generated by the address pointer 205 of RAM 204.

In accordance with the present embodiment as described above, operation can be performed a plurality of times in the length of time required for one equalization in the prior art. As a result, the training time, namely the time required for the training end signal to be outputted, can be made a fraction of that required in the prior art.

The arrangement for accomplishing this is simple since it will suffice to additionally provide only the RAM for storing the data one-dimensionally. Furthermore, since it will suffice if the RAM is incorporated in an already existing DSP, almost no modification of hardware is required.

Further, in accordance with this embodiment, training data normalized by CCITT in the prior art can be used as is. Accordingly, it is unnecessary to use special data other than the normalized data as the training data. This makes it possible to simplify the arrangement.

In the arrangement of the equalizer, it has been described that the delay time of the data delay element is adopted as the modulation period. However, the invention is not limited to this arrangement. For example, the invention can be applied as is to a double sampling equalization method (see "Equalizing Method for Absorbing Timing Phase Shift" of the Communication Systems Study Meeting; May, 1974).

The present invention is not limited to the abovedescribed equalizer. It can be arranged so that automatic setting of other reception characteristics is performed in the AGC 111 of FIG. 2, by way of example.

In accordance with the embodiment as described above, data received in the past is used. This makes possible fast training, in which a normalized training signal can be used as is, by means of a simple arrangement relying upon a memory.

In a case where a DSP is used as the signal processor, it is possible to employ an internal RAM as the memory for storing data. It is therefore unnecessary to make any changes in structure.

Furthermore, since the normalized training data can be used, fast training can be realized even when received from another ordinary modem. The result is that information can be transmitted with highly efficient line utilization.

This high utilization efficiency is realized especially in the case mentioned in the above-described publication.

Second Embodiment

In the embodiment described above, equalizing processing is performed using data received in the past. However, the invention is not limited to the foregoing embodiment, and an arrangement can be adopted in which equalizing processing which includes jitter phase control is executed.

Figure 7:
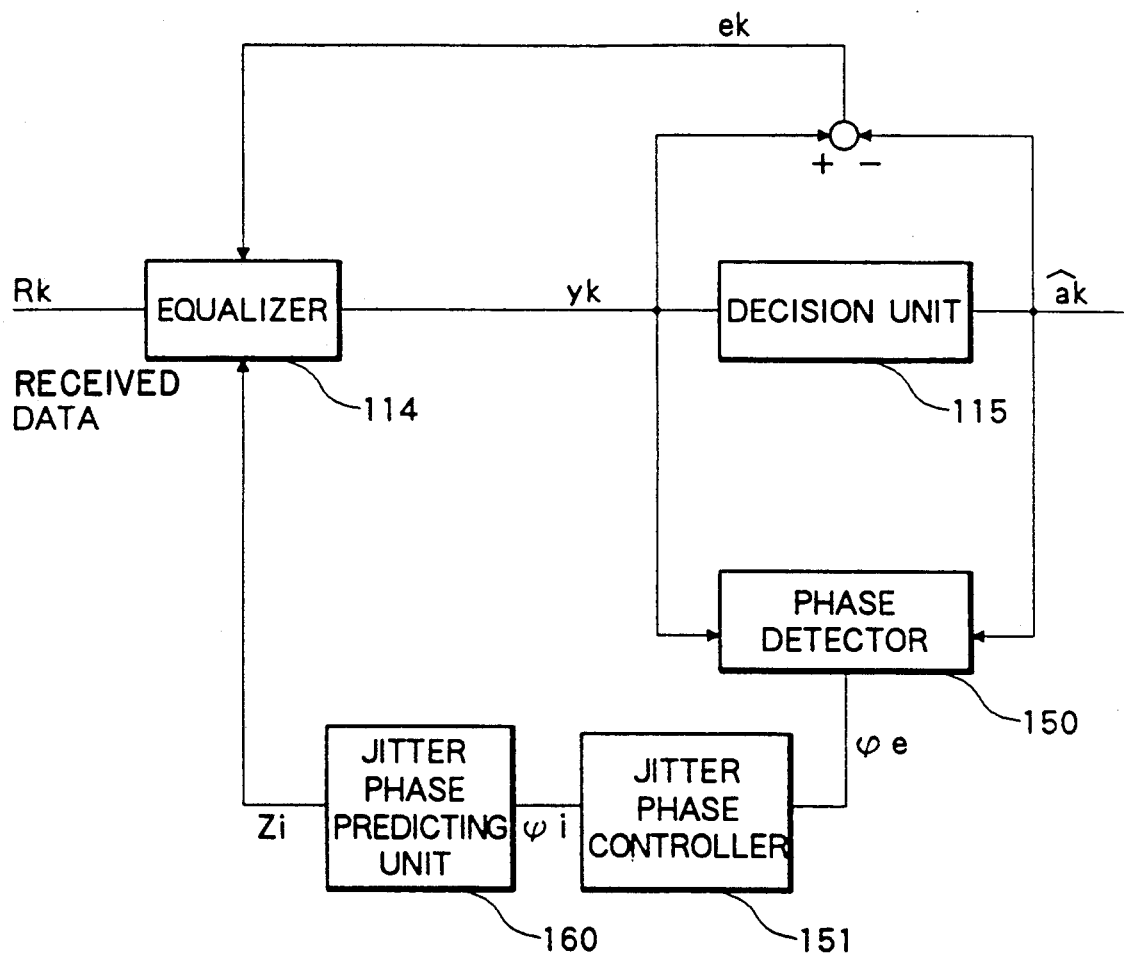
FIG. 7 is a block diagram illustrating the construction of an equalizing processor according to a second embodiment of the invention.

A second embodiment of the invention having such an arrangement is illustrated in FIG. 7.

A characterizing feature of the second embodiment is that jitter phase control is not performed using average values. Instead, the arrangement is such that a jitter component within the equalizer span is detected and each tap gain of the transversal filter contained in the equalizer is directly controlled. This makes it possible to remove the jitter component in the abovementioned span and obtain a higher jitter suppression capability than in the prior art.

This second embodiment of the invention will now be described in detail with reference to the drawings.

Figure 15:
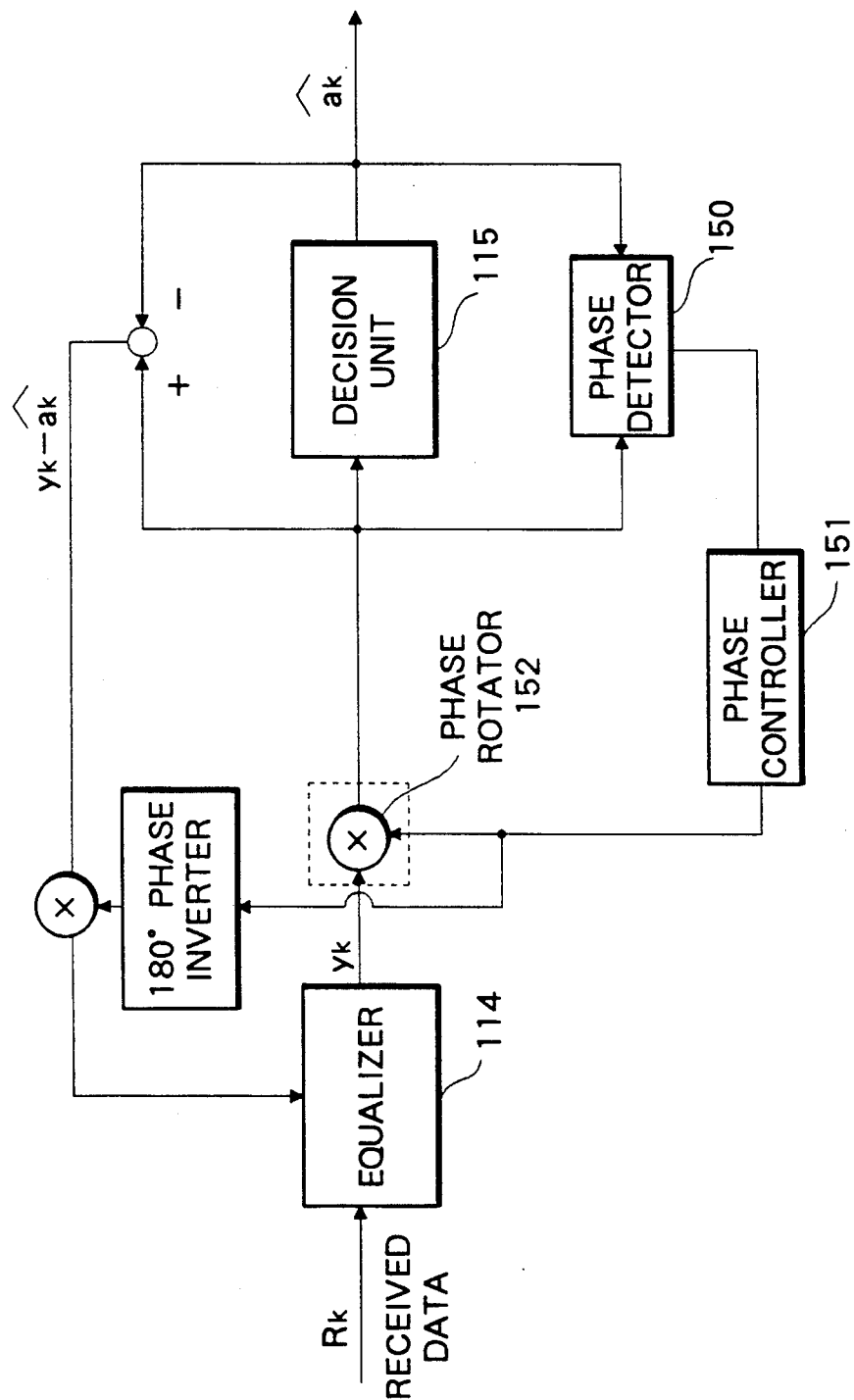
FIG. 15 is a block diagram showing a line jitter control method according to the prior art.

In FIG. 7, numerals 114, 115 respectively denote the equalizer and decision unit of FIG. 2. Numerals 150, 151 respectively denote the phase detector and jitter phase controller in the prior-art example of FIG. 15 described above. In the case of phase modulation, by way of example, the phase detector 150 divides the equalizer output yk by ak and is capable of detecting it by taking the imaginary number portion (the signal is treated as a complex number). The phase controller is a filter having a transmission function of second degree or higher.

Figure 8:
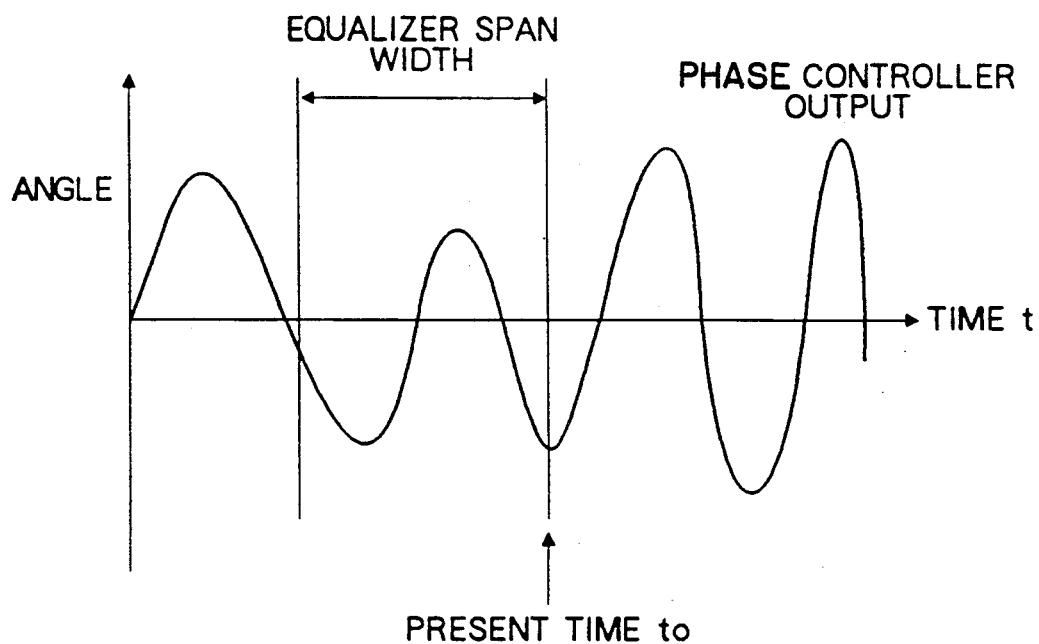
FIG. 8 is a graph illustrating a jitter control variable in the second embodiment.

The output of the jitter phase controller 151 when the line fluctuation component is solely phase jitter is shown in FIG. 8. In accordance with the prior-art method, the output value of the phase detector 150 at the point of the arrow mark is controlled to be fed back to the output, where the point of the arrow mark represents the present point in time. Accordingly, in the prior art, the average jitter component is fed back to the equalizer output in the span of the equalizer. In the present embodiment, on the other hand, it is attempted to feed the realtime jitter component back to each tap gain of the equalizer and not the jitter component in the average jitter width within the time span (equalizer span) seen by the equalizer at the present point in time shown in FIG. 9(a).

In this embodiment, a future, unknown jitter component indicated by the dashed line in FIG. 9(a) must be predicted from the past jitter component. This prediction is carried out by a jitter phase predicting unit shown in FIG. 7.

An example of the predicting method is shown in FIG. 9(b). Here the jitter component obtained up to the present point in time is folded over at the present point in time to form a mirror image, which is used as the predicted component. Various other methods of making this prediction are conceivable. For example, use can be made of an interpolation method in which a linear approximation is made based upon the jitter waveform up to the present time.

There are many cases in which actual processing of this kind is performed using a programmable digital signal processor (DSP). To change the method of prediction, it will suffice to alter the software As a result, it is unnecessary to modify the hardware configuration each time to form, e.g., the abovementioned jitter phase predicting unit.

Figure 10:
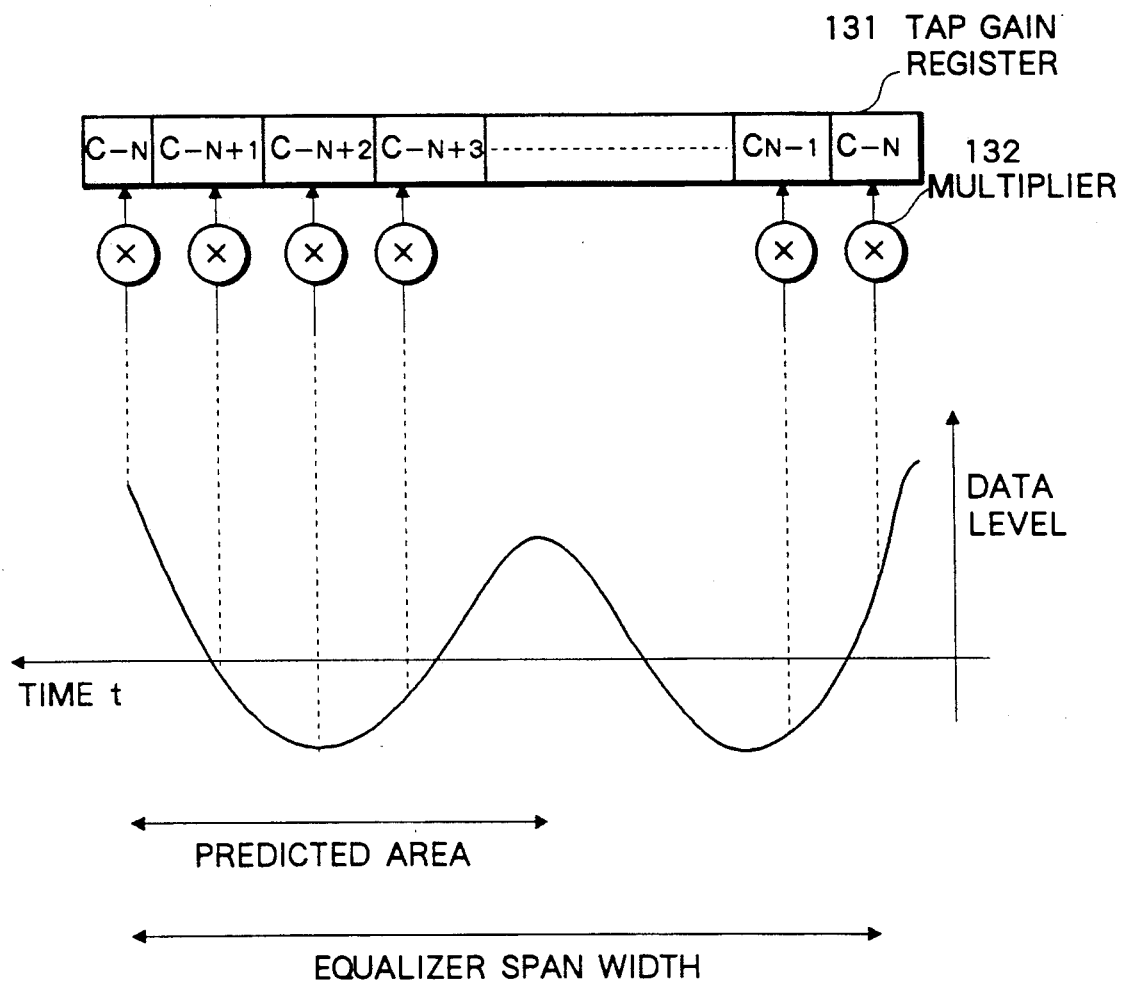
FIG. 10 is a view illustrating a jitter correcting method according to the second embodiment.

In this embodiment, the output of the predicting unit 160 is fed back directly to each tap gain of the equalizer. The manner in which this is done is shown in FIG. 10.

In a case where the DSP is used, each tap gain of the equalizer 114 is stored in memory (the top gain register 131). Each tap gain is multiplied by the output of the jitter predicting unit 160 using the multipliers 132. The arrangement of the gap gains at this time is $C_{-N} \sim C_N$. The smaller the value of the index (N or -N) the further into the future the data is. Therefore, the time axis of the predicted jitter that is to multiply the tap gains has a direction opposite that in FIG. 9(b).

In order to minimize loss of the equalizing performance of the equalizer, the timing of jitter correction is performed by weighting each tap gain before tap updating by the error signal in the MSE method of Eq. (2). In this case, there will be no deterioration in the original equalizing performance of the equalizer.

Thus, in accordance with the present embodiment, the jitter component in the time span covered by the equalizer is predicted and each tap gain is adjusted using this predicted data. The result is jitter control more accurate than that in the prior art.

By using a modem to which the present embodiment is applied as set forth above, data can be transmitted reliably, without the influence of jitter, via an ordinary pay line.

In the embodiment described above, the adopted method of predicting the unknown portion of jitter is the simplest, namely a method in which use is made of a mirror image of the jitter component up to the present time. However, various other predicting means, such as those that rely upon probability statistics, can be used. For example, it is possible to discriminate a past jitter component and extract a frequency component having the highest percentage in the past jitter component. Alternatively, data corresponding to a jitter component having the highest possibility of occurring as judged from a past period can be set in the tap register.

In the description given above, an ordinary equalizer is employed. However, the invention is not limited to this arrangement. It goes without saying that the invention can be applied also to a double sampling equalization method (see "Equalizing Method for Absorbing Timing Phase Shift" of the Communication Systems Study Meeting; May, 1974).

Though a telephone line has been considered as the transmission line in the above embodiments, the receiving apparatus of the invention is not limited thereto. For example, it goes without saying that the apparatus may include means for suppressing the jitter component of a signal reproduced from a recording medium having jitter.

In accordance with the embodiment as described above, a method is adopted in which the jitter component in the span width of an equalizer is removed in its entirety. As a result, in comparison with the conventional average value-type removal method, jitter suppression is greater and high-quality data can be transmitted with less transmission error.

Third Embodiment

Figure 14:
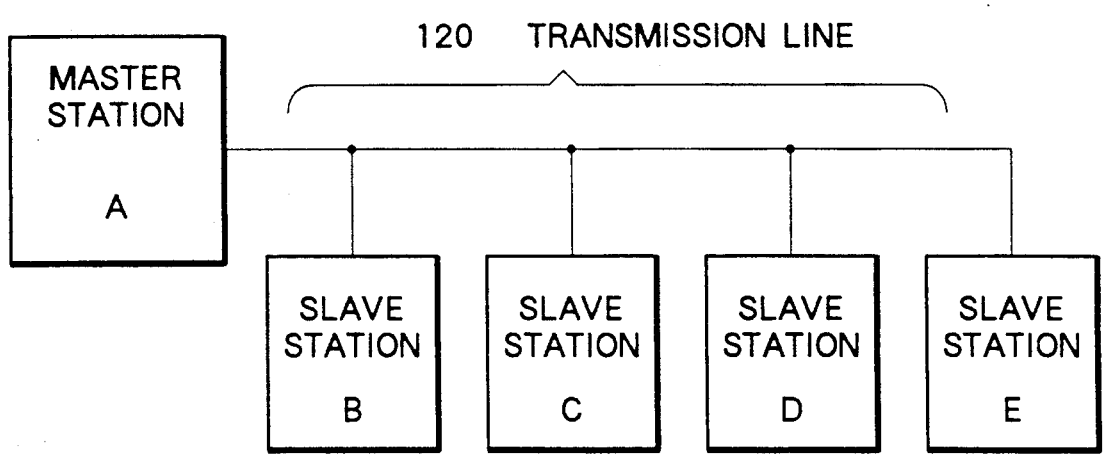
FIG. 14 is a view showing the construction of a common polling system.

Even if use is made of the means for presetting the abovementioned predicted inverse characteristic of the line in the tap gains of the equalizer, there is a limitation upon how much the equalizing speed can be raised, as in the case of FIG. 14 where the line states between the slave stations and the master station differ from one another.

In order to raise the equalizing speed even in a case such as this, it will suffice to adopt an arrangement in which the inverse characteristic of the transmission characteristic is stored in advance for each and every line state (i.e., for each and every slave station), one of these stored inverse characteristics is selected and receiving data equalizing processing is executed in accordance with the selected characteristic. For example, these inverse characteristics may be stored in the ROM 162 shown in FIG. 1.

Figure 11:
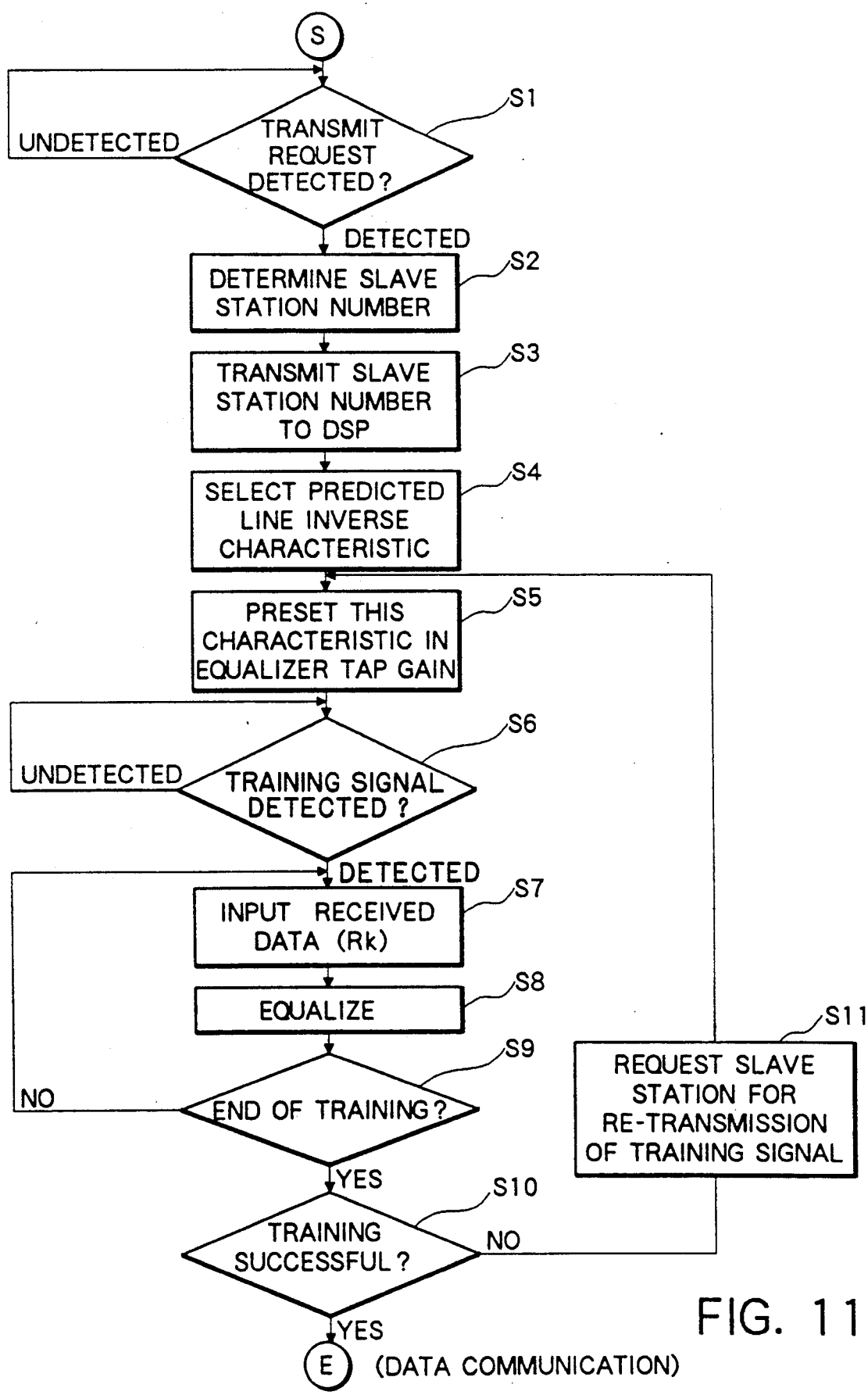
FIG. 11 is a flowchart illustrating synchronizing processing control of a modem in a third embodiment of the invention.
Figure 12:
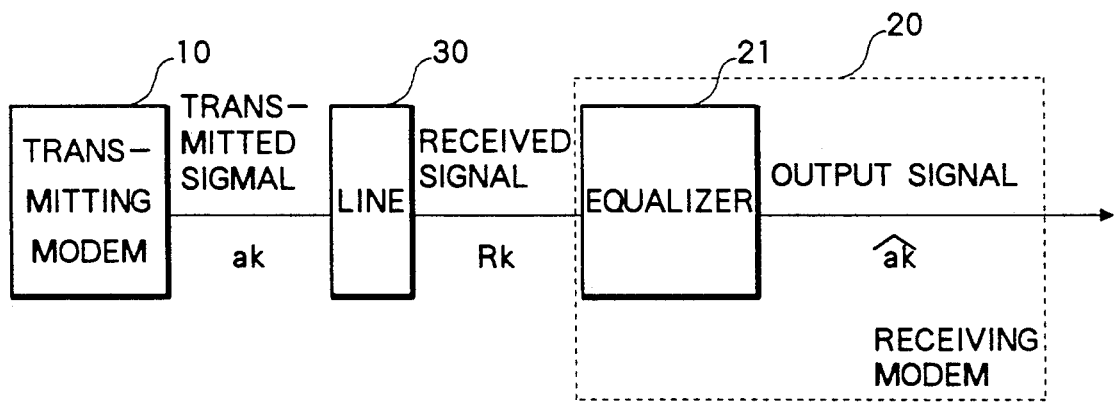
FIG. 12 is a view for describing the general flow of transmitted signals.
Figure 13A:
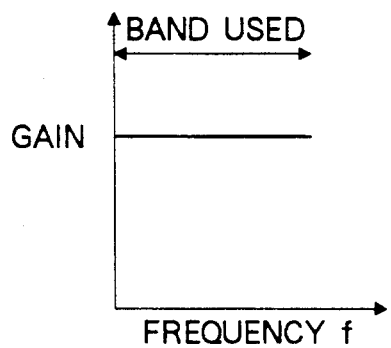
FIG. 13(a) is a view showing the frequency characteristics of a line.
Figures 13B, 13C:
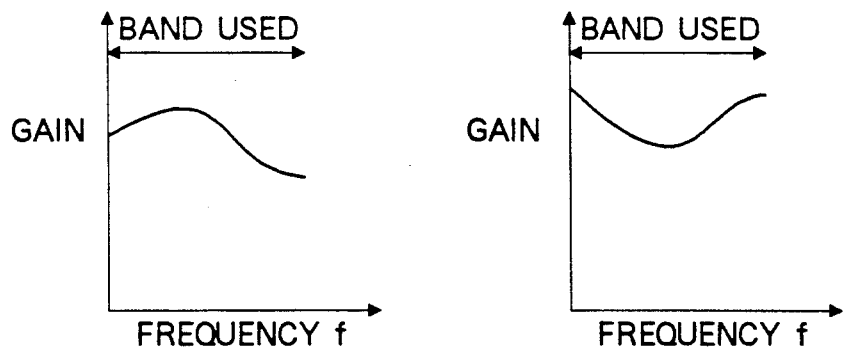
FIG. 13(b) is a view showing the frequency characteristics of an equalizer.
FIG. 13(c) is a view showing the frequency characteristics of a transmitted signal from a modem on a transmitting side and the frequency characteristics of an output signal corrected by the equalizer.

A case in which the inverse characteristic for each line state (each slave station) is stored in memory (e.g., the ROM 162) and equalizing processing is executed using these stored inverse characteristics as will now be described with reference to the flowchart of FIG. 11.

The following description will be given taking the arrangement of FIG. 1 as an example.

At a step S1, the CPU 160 performs monitoring to determine whether a transmission request has been transferred from a slave station via the transmission line 120, analog IC 164 and DSP 161. The program proceeds to a step S2 if a transmission request is transmitted and transferred to the CPU 160 from any of the slave stations. By using information indicating the origin of the request, the CPU 160 determines from which slave station the request has been transmitted. Next, at a step S3, the number of the slave station found to have transmitted the request is transferred to the DSP 161 to inform the same. This is followed by a step S4, at which the DSP 161 receives the slave station number and selects the predicted inverse characteristic corresponding to this slave station from the plurality of these predicted inverse characteristics stored in memory (e.g., the ROM 162). A step S5 calls for this characteristic to be preset in the initial tap gain (the pertinent location in RAM 163, by way of example) of the equalizer. The presetting of the initial equalizing tap gain of the equalizer is ended by this processing. The initial tap gain value is a predicted inverse characteristic conforming to the transmission frequency characteristic of the slave station connecting line. The equalizing processing that follows can be executed at high speed and high accuracy.

As shown in the following table, the predicted inverse characteristics of the line stored in the ROM 162 are assigned to correspond to the slave stations outputting transmission requests. Here it will suffice if the plurality of predicted inverse characteristics set in the memory in advance are decided depending upon the distances between slave stations. (For example, if expressed in terms of the number of links, the inverse characteristics of low link numbers will be stored in the memory in case of near stations and the inverse characteristics of high link numbers will be stored in the memory in case of distant stations.)

| SLAVE STATION TRANSMITTING REQUEST | PREDICTED INVERSE CHARACTERISTIC |
| --- | --- |
| SLAVE STATION B | F(B) |
| SLAVE STATION C | F(C) |
| SLAVE STATION D | F(D) |
| SLAVE STATION E | F(E) |

A step S6 calls for the system to wait for receipt of a training signal from a slave station, the signal being outputted on the line. When the training signal is received, the program proceeds to a step S7, at which the received signal Rk from the line is inputted, and then to a step S8, at which the error signal is computed from the received signal Rk and training pattern and the results are used to execute equalizing processing for, e.g., correcting tap gain. Next, at a step S9, the CPU 160 measures a predetermined training time period and determines whether training has ended. If training has not ended, the program returns to the step S7 and equalizing processing is performed for the next received signal Rk.

When training processing ends, the program proceeds from the step S9 to a step S10, at which it is confirmed whether the error is smaller than a reference value TH. If the answer is YES, equalizing and training end. Thereafter, the pertinent slave station is informed of the end of training via the DSP 160 and analog IC 163, and a data transmission from this location station starts.

If the error is larger than the reference value TH, the CPU 160 outputs a training request to the slave station at a step S11 to inform this station of the fact that training has failed. In accordance with this signal, the slave station re-transmits the training signal so that the foregoing training processing is repeated.

In the embodiment described above, inverse characteristics of a line in accordance with each slave station are preset, from which state equalization is performed for each slave station. As a result, data transmission is possible at a fixed, high-speed response at all times regardless of the slave station.

According to the method of the foregoing embodiment, the inverse characteristics of the line are preset in the tap gains of the equalizer. However, the invention is not limited to such an arrangement. A transversal filter having effects the same as those of the invention can be installed as a pre-equalizer separately from or ahead of an ordinary equalizer. This will make it possible to lighten the load of the ordinary equalizer.

In the foregoing embodiment, a CPU is used for sequential control and the like in the modem. However, the invention is not limited to such an arrangement.

Because of recent improvements in DSP's, it is now possible to rely solely upon a DSP for sequential control without using a CPU. In such case, the modem can be constructed solely of a DSP and analog IC.

In accordance with the present embodiment, as described above, a plurality of predicted inverse characteristics of a line are prepared in advance and, when a transmission request is issued by a station, the characteristics of this station are preset, after which equalizing processing can be executed. Consequently, rapid equalizing and synchronizing processing can be performed regardless of the station and a transmission is possible at high accuracy and great speed. As a result, line utilization efficiency is improved, communication speed is raised and high-speed, inexpensive data communication is made possible.

As many apparently widely different embodiments of the present invention can be made without departing from the spirit and scope thereof, it is to be understood that the invention is not limited to the specific embodiments thereof except as defined in the appended claims.

Furthermore, in accordance with the embodiments, a plurality of inverse characteristics of lines for the equalizer are prepared in dependence upon the destinations of communication. However, the invention is not limited to such an arrangement, for it is possible to adopt an arrangement in which a plurality of reception characteristics conforming to the line characteristics of the destinations of communication are prepared as characteristics other than those of the equalizer in the receiving section.

What is claimed is:

1. A receiving apparatus comprising:
   receiving means for receiving data;
   first storing means for simultaneously storing plural cycles of received data; and
   setting means for setting reception characteristics of said receiving means a plural number of times by reading out plural cycles of the received data previously stored in said first storing means, cycle by cycle, after said receiving means has received one cycle of data and before it receives the next cycle of data.

2. The apparatus according to claim 1, wherein said setting means randomly reads out plural cycles of previously-received data stored in said storing means cycle by cycle, and sets reception characteristics using said data.

3. The apparatus according to claim 1, wherein said receiving means further comprises an equalizer, and wherein said reception characteristics are equalizing characteristics of said equalizer.

4. The apparatus according to claim 3, wherein said equalizer has a transversal filter and control of the equalizing characteristics of said equalizer is performed by setting tap gains of said transversal filter in accordance with the received data.

5. The apparatus according to claim 1, wherein the received data is training data.

6. A receiving apparatus according to claim 1, wherein said setting means is controlled to set reception characteristics using a different set of plural cycles of received data, after said receiving means has received one cycle of data and before it receives another cycle of data.

7. A receiving apparatus according to claim 1, wherein said setting means sets the reception characteristics by reading out plural cycles of data received prior to said one cycle of data.

8. An apparatus according to claim 1, wherein said receiving means further comprises second storing means for storing one cycle of data, and said setting means sets reception characteristics of said receiving means based on data stored in said second storing means.

9. An apparatus according to claim 8, wherein said setting means transfers plural cycles of the received data previously stored in said first storing means, cycle by cycle, to said second storing means, and set reception characteristics each time one cycle of the received data is transferred.

10. A receiving apparatus comprising:
    discriminating means for discriminating original data from equalized data equalized by an equalizer which equalizes data received via a communication medium;
    detecting means for detecting a jitter component in an output signal from the equalizer on the basis of a phase difference between the equalized data equalized by the equalizer and the original data discriminated by said discriminating means;
    feedback means for feeding back a difference between the equalized data equalized by the equalizer and the original data discriminated by said discriminating means to the equalizer; and
    control means for controlling an equalizing characteristic of the equalizer in dependence upon the jitter component detected by said detecting means.

11. The apparatus according to claim 10, wherein said equalizer has a transversal filter, and said control means controls tap gains of said transversal filter in dependence upon the jitter component detected by said detecting means.

12. The apparatus according to claim 10, wherein said control means includes means for controlling the equalizing characteristics of the equalizer upon predicting a forthcoming jitter component from a past jitter component detected by said detecting means.

13. The apparatus according to claim 12, wherein said control means predicts the jitter component by forming a mirror image of a jitter component, which is obtained up to a present point in time, by folding over said obtained jitter component at the present point in time, and using said mirror image as a prediction portion.

14. A receiving apparatus according to claim 10, wherein said equalizer further comprises memorizing means for memorizing the equalizing characteristics.

15. A receiving apparatus according to claim 14, wherein said equalizer equalizes the received signal in accordance with the equalizing characteristics memorized by said memorizing means.

16. A receiving apparatus comprising:
    receiving means for receiving data;
    storing means for storing the data received by said receiving means; and
    adjusting means for carrying out adjustment of a reception characteristic of said receiving means based on the data received by said receiving means,
    wherein said receiving means receives a first cycle of data, a second cycle of data and a third cycle of data in that order, and said adjusting means carriers out adjustment based on the first cycle of received data read out from said storing means during an interval between an adjustment based on the second cycle of received at a and an adjustment based on the third cycle of received data.

17. The apparatus of claim 16, wherein said adjusting means further comprises a shift register to store the received data, and said storing means is adapted to store previously-received plural cycles of data to cause the data received by said receiving means to be stored in said shift register and said storing means.

18. The apparatus of claim 16, wherein said storing means is adapted to store plural cycles of received data, and said adjusting means further comprises designating means for designating data to be read out from among the plural cycles of data.

19. The apparatus of claim 16, wherein said receiving means further comprises an equalizer, and wherein said reception characteristic is an equalizing characteristic of said equalizer.

20. The apparatus of claim 19, wherein said equalizer has a transversal filter and control of the equalizing characteristic of said equalizer is performed by setting tap gains of said transversal filter in accordance with the received data.

21. The apparatus of claim 16, wherein said adjusting means adjusts the reception characteristic in accordance with training data received by said receiving means.

22. An apparatus of claim 16, wherein said receiving means further comprises second storing means for storing one cycle of data, and said adjusting means adjusts reception characteristics of said receiving means in accordance with data stored in said second storing means.

23. The apparatus according to claim 22, wherein said adjusting means transfer plural cycles of the received data previously stored in said first storing means, cycle by cycle, to said second storing means, and adjusts reception characteristics each time one cycle of the received data is transferred.

24. A receiving apparatus comprising;
receiving means for receiving data;
first memory means having a storage capacity sufficient for storing one cycle of received data;
second memory means for simultaneously storing plural cycles of received data;
adjusting means for adjusting a reception characteristic of said receiving means in accordance with the data stored in said first memory means; and
transferring means for transferring the plural cycles of data, cycle by cycle, from said second memory means to said first memory means after said receiving means has received one cycle of data and before it receives the next cycle of data, wherein said adjusting means adjusts, cycle by cycle, the reception characteristic a plural number of times in accordance with the plural cycles of data transferred by said transferring means.

25. A receiving apparatus according to claim 24, wherein said adjusting means adjusts, cycle by cycle, the reception characteristics in accordance with the plural cycles of data transferred from said second memory means during reception by said receiving means.

26. A receiving apparatus according to claim 24, wherein said first memory means comprises a shift register.

27. A receiving apparatus according to claim 24, wherein said second memory means comprises a RAM.

28. A receiving apparatus according to claim 24, wherein said reception characteristic is an equalizing characteristic.

29. A receiving apparatus according to claim 24, wherein said adjusting means adjusts tap gains of a transversal filter for equalizing the received data.

30. A receiving apparatus according to claim 24, wherein said adjusting means adjusts the reception characteristic in accordance with training data received by said receiving means.

31. A receiving apparatus according to claim 24, wherein said receiving means sequentially receives the first cycle of data, the second cycle of data and the third cycle of data, and said transferring means transfers, cycle by cycle, the plural cycles of data received prior to the first cycle of data after the first cycle of data has been received and before the second cycle of data is received.

32. A receiving apparatus according to claim 24, wherein said adjusting means carries out the adjustment of the reception characteristic based on the plural cycles of the data, cycle by cycle, during the interval between the adjustment based on the first cycle of data and the adjustment based on the second cycle of data.

33. A receiving apparatus which receives data via a communication medium, comprising:
equalizing means for equalizing distortion of received data, based on a frequency characteristic of the communication medium, by means of a plural number of corrective coefficients;
discriminating means for discriminating original data from the equalized data equalized by said equalizing means;
detecting means for detecting a jitter component in an output signal output from said equalizing means on the basis of a phase difference between the equalized data equalized by the equalizer and the the original data discriminated by said discriminating means;
feedback means for feeding back a difference between the equalized data equalized by the equalizer and the original data discriminated by said discriminating means to said equalizing means; and
controlling means for controlling said corrective coefficients in accordance with the detected jitter component.

34. A receiving apparatus according to claim 33, wherein said equalizing means further comprises:
memorizing means for memorizing said corrective coefficients; and
setting means for setting said corrective coefficients to be memorized by said memorizing means, in accordance with the received data.

35. A receiving apparatus according to claim 33, wherein said equalizing means corrects the received signal in accordance with said corrective coefficients.

36. A receiving apparatus according to claim 33, wherein said equalizing means memorizes said corrective coefficients in a tap gain register.

37. A receiving apparatus according to claim 33, wherein said controlling means controls said corrective coefficients in accordance with jitter components predicted from the detected jitter components.

38. A receiving apparatus according to claim 37, wherein said controlling means controls said corrective coefficients in accordance with a mirror image of the detected jitter components.

39. A receiving apparatus comprising:
receiving means for receiving data;

first storing means for simultaneously storing plural cycles of data received by said receiving means; and adjusting means for adjusting reception characteristics of said receiving means, wherein said adjusting means adjusts reception characteristics of said receiving means a plural number of times by reading out plural cycles of the received data from said storing means, after having adjusted reception characteristics in accordance with one cycle of data received by said receiving means and before the next cycle of data is received by said receiving means.

40. An apparatus according to claim 39, wherein said receiving means further comprises second storing means for storing one cycle of data, and said adjusting means adjusts reception characteristics of said receiving means in accordance with data stored in said second storing means.

41. An apparatus according to claim 40, wherein said adjusting means transfers plural cycles of the received data previously stored in said first storing means, cycle by characteristics each time one cycle of the received data is transferred.

42. An equalizing characteristics setting method comprising the steps of:

discriminating original data from received data;

detecting a jitter component based on a phase difference between the received data and the original data;

feeding back a difference between the received data and the original data to an equalizer; and setting an equalizing characteristic of the equalizer in accordance with the jitter component detected in the detecting step.

43. An equalizing characteristics setting method according to claim 42, wherein the jitter component is detected from equalized data at the detecting step.

44. An equalizing characteristics setting method according to claim 42, wherein the equalizing characteristic of the equalizer is set in accordance with a mirror image of the detected jitter component.

45. An equalizing characteristic setting method according to claim 42, wherein the equalizing characteristics have a plurality of coefficients and each of said coefficients is set at the setting step.

46. An equalizing characteristic setting method according to claim 42, wherein the jitter component correcting characteristics and the equalizing characteristics have respective coefficients, and wherein the coefficients of the jitter component correcting characteristics are multiplied by the coefficients of the equalizing characteristics at the setting step.

* * * * *

UNITED STATES PATENT AND TRADEMARK OFFICE
CERTIFICATE OF CORRECTION

PATENT NO. : 5,175,746
DATED : December 29, 1992
INVENTOR(S) : YUTAKA INOUE, ET AL.

It is certified that error appears in the above-identified patent and that said Letters Patent is hereby corrected as shown below:

Title page, item
[57] ABSTRACT

Line 2, "model" should read --modem--.

COLUMN 7

Line 6, "@$_k$" should read --$\hat{a}_k$--.
  Line 7, "$a_k = a_k$" should read --$\hat{a}_k = a_k$--.
  Line 8, "$Y_k$- @$_k$" should read --$y_k - \hat{a}_k$--.
  Line 45, "data" should read --data from--.

COLUMN 13

Line 44, "means" should read --means,--.

COLUMN 14

Line 10, "set" should read --sets--.
  Line 67, "at a" should read --data--.

COLUMN 15

Line 32, "transfer" should read --transfers--.
  Line 37, "comprising;" should read --comprising:--.
  Line 58, "characteristics" should read --characteristic--.

COLUMN 16

Line 16, "claim 24," should read --claim 31,--.

UNITED STATES PATENT AND TRADEMARK OFFICE
CERTIFICATE OF CORRECTION

PATENT NO. : 5,175,746

DATED : December 29, 1992

INVENTOR(S) : YUTAKA INOUE, ET AL.

It is certified that error appears in the above-identified patent and that said Letters Patent is hereby corrected as shown below:

COLUMN 17

Line 23, "by characteristics" should read --by cycle, to said second storing means, and adjusts reception characteristics--.

COLUMN 18

Line 16, "characteristic" should read --characteristics--.
Line 20, "characteristic" should read --characteristics--.

Signed and Sealed this

Thirtieth Day of November, 1993

BRUCE LEHMAN

Attest:

Attesting Officer

Commissioner of Patents and Trademarks